United States Patent
Park et al.

(10) Patent No.: US 9,194,035 B2
(45) Date of Patent: Nov. 24, 2015

(54) NON-ADHESIVE SPUTTERING STRUCTURE INCLUDING A SPUTTERING TARGET AND BACKING PLATE

(75) Inventors: Kyung Il Park, Anyang-si (KR); Keun-Ik Jeon, Cheonan-si (KR); Sang-Su Kim, Yongin-si (KR); Youn-Yong Lee, Asan-si (KR)

(73) Assignees: SAMSUNG DISPLAY CO., LTD. (KR); YMC CO., LTD. (KR)

( * ) Notice: Subject to any disclaimer, the term of this patent is extended or adjusted under 35 U.S.C. 154(b) by 209 days.

(21) Appl. No.: 13/537,867

(22) Filed: Jun. 29, 2012

(65) Prior Publication Data

US 2013/0001077 A1   Jan. 3, 2013

(30) Foreign Application Priority Data

Jun. 30, 2011 (KR) .................. 10-2011-0064470

(51) Int. Cl.
  C23C 14/24 (2006.01)
  C23C 14/34 (2006.01)
  H01J 37/32 (2006.01)
  H01J 37/34 (2006.01)

(52) U.S. Cl.
  CPC ....... *C23C 14/3407* (2013.01); *H01J 37/32522* (2013.01); *H01J 37/3435* (2013.01); *H01J 37/3497* (2013.01); *Y10T 29/49947* (2015.01)

(58) Field of Classification Search
  CPC .............. H01J 37/3497; H01J 37/3435; H01J 37/32522
  USPC ........................... 204/298.12, 298.09, 298.01
  See application file for complete search history.

(56) References Cited

U.S. PATENT DOCUMENTS

| | | | | |
|---|---|---|---|---|
| 3,956,093 A | * | 5/1976 | McLeod | 204/192.12 |
| 4,060,470 A | * | 11/1977 | Clarke | 204/192.12 |
| 5,066,381 A | * | 11/1991 | Ohta et al. | 204/298.12 |
| 5,421,978 A | * | 6/1995 | Schuhmacher et al. | 204/298.09 |
| 2006/0260936 A1 | * | 11/2006 | Hort et al. | 204/298.02 |
| 2011/0143075 A1 | | 6/2011 | Hayashi et al. | |

FOREIGN PATENT DOCUMENTS

| | | |
|---|---|---|
| JP | 08246144 A | 9/1996 |
| JP | 10046327 A | 2/1998 |
| JP | 2003183822 A | 7/2003 |

* cited by examiner

*Primary Examiner* — Jason M Berman
(74) *Attorney, Agent, or Firm* — Cantor Colburn LLP (57) ABSTRACT

A non-adhesive sputtering structure includes a sputtering target having a plate shape; and a backing plate having a plate shape. The backing plate faces the sputtering target, and facing surfaces of the sputtering target and the backing plate are in contact with each other. The backing plate includes a body having a longitudinal axis; and a cooling member through which a cooling material flows in a longitudinal direction of the body substantially parallel to the longitudinal axis. The cooling material conducts heat generated from the sputtering target from sputtering to outside the backing plate. The non-adhesive sputtering structure further includes a plurality of non-adhesive fastening members which maintain the facing surfaces of the backing plate and the sputtering target in contact with each other. The non-adhesive fastening members are extended through a thickness of the backing plate and correspond to regions of the backing plate excluding the cooling member.

12 Claims, 4 Drawing Sheets

A-A

NON-ADHESIVE SPUTTERING STRUCTURE INCLUDING A SPUTTERING TARGET AND BACKING PLATE

This application claims priority to Korean Patent Application No. 10-2011-0064470 filed on Jun. 30, 2011, and all the benefits accruing therefrom under 35 U.S.C. §119, the entire contents of which are incorporated herein by reference.

BACKGROUND OF THE INVENTION (a) Field of the Invention

The invention relates to a glueless type connecting structure of a target and a backing plate, and more particularly, to a glueless type connecting structure of a target and a backing plate which directly connects a target with a backing plate without using an adhesive at the joint of the target and the backing plate.

(b) Description of the Related Art

In general, sputtering is used to form a wiring film for a thin film, optical recording and semiconductor field that are used in a liquid crystal panel and an organic electroluminescent panel. The liquid crystal panel and the organic electroluminescent panel are used for a television set, a notebook computer and other monitors.

In sputtering, atoms are separated from a target by applying plasma discharge between a substrate and a target that is a coated material such that an ionized gas hits against the target. The separated atoms are accumulated on the substrate, thereby manufacturing a thin film. The method has the advantage of forming a thin film having the same composition as the target, unlike vacuum depositing or ark ion plating ("AIP").

The target used in sputtering is generally soldered to a backing plate (also called, cooling plate or support body) which cools and supports the target. The backing plate includes copper or a copper alloy having relatively high thermal conductivity so as to cool the target heated in sputtering.

Regarding soldering between the target and the backing plate (support body), for example, Japanese Patent Application Laid-Open No. 2003-183822 discloses a sputtering target including a target material and a backing plate with a bonding material (e.g., soldered metal) therebetween. The backing plate has a recession for the bonding material and a groove communicating with the recession on the outer circumferential wall of the recession.

This document states that the target does not bend even if the bonding material is solidified and contracted, in the structure. However, the technology of Japanese Patent Application Laid-Open No. 2003-183822 is not directed to prevent separation of the bonding portion (soldered metal) from other elements, and particularly, has a problem in that it is necessary to use a backing plate having a complicated shape.

Japanese Patent Application Laid-Open No. 1996-246144 discloses a technology for preventing a target from bending and cracking and a soldered portion from separating, by disposing plates having larger and lower thermal expansion rates than the sputtering target on opposing surfaces of the backing plate such that the backing plate is interposed between the plates. Interposing the backing plate between the plates prevents the backing plate from bending and provides the sputtering target with the same thermal expansion property as the target to be supported. However, this technology also has a problem in that the structure of the backing plate is complicated.

Japanese Patent Application Laid-Open No. 1998-046327 discloses a method of making a target and a backing plate of an aluminum alloy in order to reduce the difference in a linear expansion rate between the two members. However, the difference in thermal expansion rate is not sufficiently and surely reduced in the composite of the target and the backing plate according to the technology, such that it is difficult to suppress cracks in a soldered metal. Further, when the backing plate includes the same material as the target which including an Al—Nd alloy, the cost is correspondingly increased.

BRIEF SUMMARY OF THE INVENTION

The invention provides a non-adhesive (e.g., glueless) type connecting structure of a sputtering target and a backing plate, having advantages of reducing the time and cost for manufacturing by mechanically directly combining the sputtering target with the backing plate without using an adhesive.

The invention provide a non-adhesive (e.g., glueless) type connecting structure of a sputtering target and a backing plate that can reduce the manufacturing cost and improve durability of the backing plate against thermal expansion by firmly combining the sputtering target with the backing plate and simplifying the structure of outer surfaces of the backing plate.

An exemplary embodiment of the invention provides a non-adhesive sputtering structure including: a sputtering target having a plate shape; and a backing plate having a plate shape. The backing plate faces the sputtering target, and facing surfaces of the sputtering target and the backing plate are in contact with each other. The backing plate includes a body having a longitudinal axis; and a cooling member through which a cooling material flows in a longitudinal direction of the body parallel to the longitudinal axis in order to conduct heat from the sputtering target to the outside of the backing plate. The structure further includes a plurality of non-adhesive fastening members which fix the sputtering target and the backing plate to each other and correspond to portions of the backing plate excluding the cooling member.

The cooling member may have an inlet at a first longitudinal end of the backing plate through which the cooling material passes and an outlet at the first longitudinal end of the backing plate through which the cooling material is discharged to the outside of the backing plate.

The cooling member may be at the portions of the backing plate which correspond to the portions of the sputtering target where a relatively large amount of erosion of the sputtering target is generated in sputtering, and the non-adhesive fastening members may be disposed at the portions of the sputtering target where a relatively small amount of erosion of the sputtering target is generated in sputtering.

The non-adhesive fastening members may be disposed at predetermined distances in parallel along both edges in the longitudinal direction of the backing plate, and disposed at the center portion in the longitudinal direction of the backing plate. The non-adhesive fastening members disposed at the center portion of the backing plate may be disposed between adjacent non-adhesive fastening members disposed along both edges of the backing plate, in the longitudinal direction.

An alignment pin may be disposed at the center portion of the sputtering target and the backing plate in contact with each other, in order to center the sputtering target and the backing plate when the sputtering target and the backing plate are brought in contact with each other.

The backing plate further includes fastener receiving members which are extended through a thickness of the backing plate and through which a lead portion of the non-adhesive fastening members are passed. A width of a lower portion of the fastener receiving members is larger than a width of an upper portion of the fastener receiving members, and heads of the non-adhesive fastening members are received in the lower portion. The width of the upper portion of the fastener receiving members is larger than a width of the lead portion, and a predetermined space is between an inner wall of the upper portion of the fastener receiving members and an outer surface of the lead portion. The width of the lower portion of the fastener receiving members is larger than a width of the head, and a predetermined space is between an inner wall of the lower portion of the fastener receiving members and an outer surface of the head.

A fixing member including metal relatively stronger than a material of the backing plate may have a width larger than the width of the upper portion of the fastener receiving members, and is in contact with both the step and the head of the non-adhesive fastening member to fix the backing plate and the sputtering target in contact with each other even though the backing plate thermally expands.

Further, the backing plate may have an outwardly extended step at the lower end of both sides of the cooling member. The step is extended in the longitudinal direction. The structure may further include a cover having a plate shape. The cover is attached to the step and closes the cooling member to the outside.

The lower surface of the backing plate and the lower surface of the cover may be coplanar.

The sputtering target and the backing plate may have an average coefficient of thermal expansion of $19 \times 10^{-6}/°$ C. or less at temperature of about 20° C. to about 160° C., and the sputtering target and the backing plate may include one of aluminum (Al) and copper (Cu).

An exemplary embodiment of the invention provides a method of forming a structure for sputtering, the method comprising: disposing a sputtering target including a target material, facing and contacting a backing plate; wherein the backing plate comprises: a body having a longitudinal axis; and a cooling member through which a cooling material flows in a longitudinal direction of the body substantially parallel to the longitudinal axis, wherein the cooling material conducts heat generated from the sputtering target from sputtering, to outside the backing plate; and disposing a plurality of non-adhesive fastening members through a thickness of the backing plate and into the sputtering target, wherein the plurality of non-adhesive fastening members corresponds to regions of the backing plate excluding the cooling member, and maintains facing surfaces of the backing plate and the sputtering target in contact with each other.

In the exemplary embodiments of the non-adhesive (e.g., glueless) type connecting structure of a sputtering target and a backing plate according to the invention, the time and cost for manufacturing are relatively small by mechanically directly combining the sputtering target with the backing plate.

Further, it is possible to reduce the manufacturing cost and improve durability of a backing plate against thermal expansion by simplifying the structure of the outer circumference and outer surfaces of the backing plate.

BRIEF DESCRIPTION OF THE DRAWINGS

The above and other features of this disclosure will become more apparent by describing in further detail exemplary embodiments thereof with reference to the accompanying drawings, in which.

DETAILED DESCRIPTION OF THE INVENTION

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "lower," "under," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "lower" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

A sputtering target includes a material different from a backing plate, and includes the metallic material of the substrate corresponding to the film to be finally formed, such as aluminum, an aluminum alloy, Mo, Ta or Ti. However, the stacked body achieved by soldering members of the sputtering target and the backing plate which include different metallic materials is easily bent, such that continuous correction is necessary during forming of a thin film.

Further, even though a thin film is formed by using the stacked body corrected as described above, heating and cooling are necessarily repeated during the processing of a semiconductor, such that bending is generated again. Therefore, there is a problem in that a process of forming a thin film is complicated because bending of the stacked material and correction of the bent stacked body need to be continuously repeated in forming a film.

Hereinafter, exemplary embodiments that do not limit the invention are described in detail with reference to the accompanying drawings.

Figure 1:
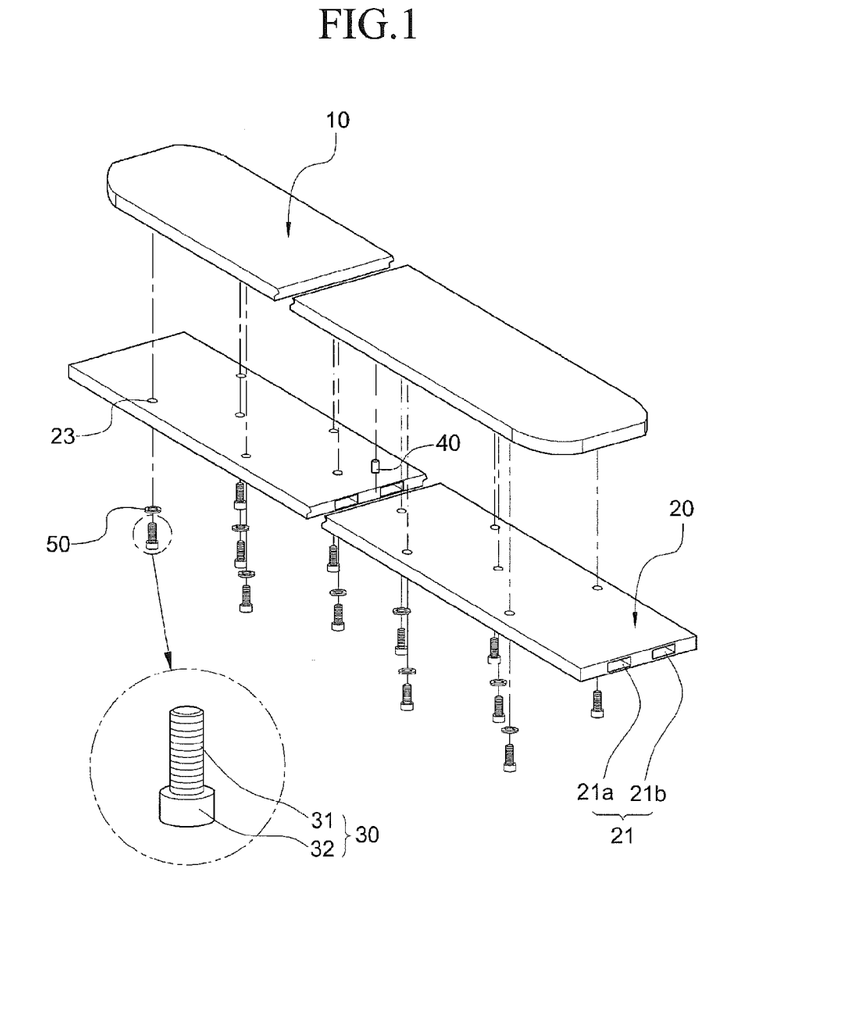
FIG. 1 is an exploded perspective view showing an exemplary embodiment of a non-adhesive type connecting structure of a sputtering target and a backing plate according to the invention.
Figure 2:
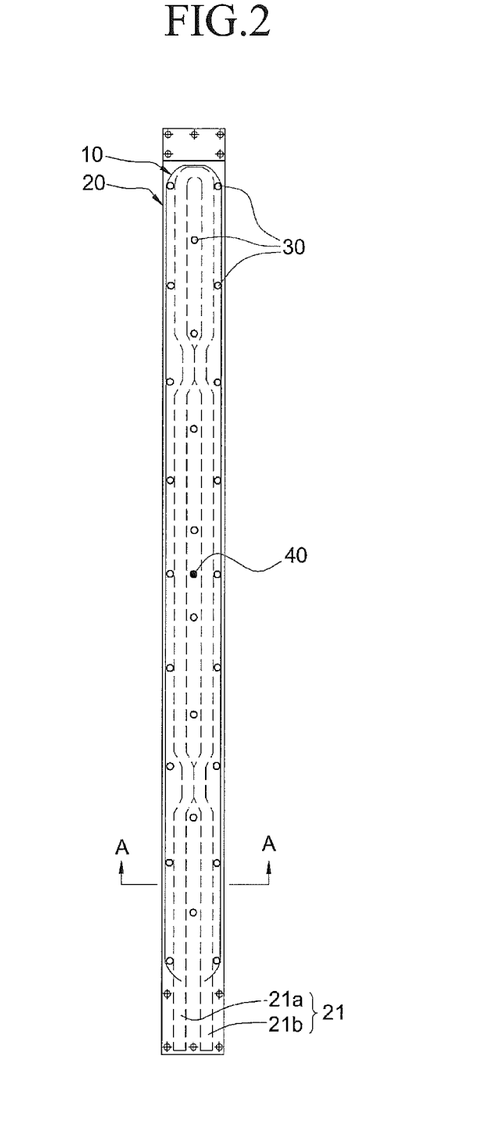
FIG. 2 is a plan perspective view showing the non-adhesive type connecting structure of the sputtering target and the backing plate of FIG. 1 according to the invention.
Figure 3:
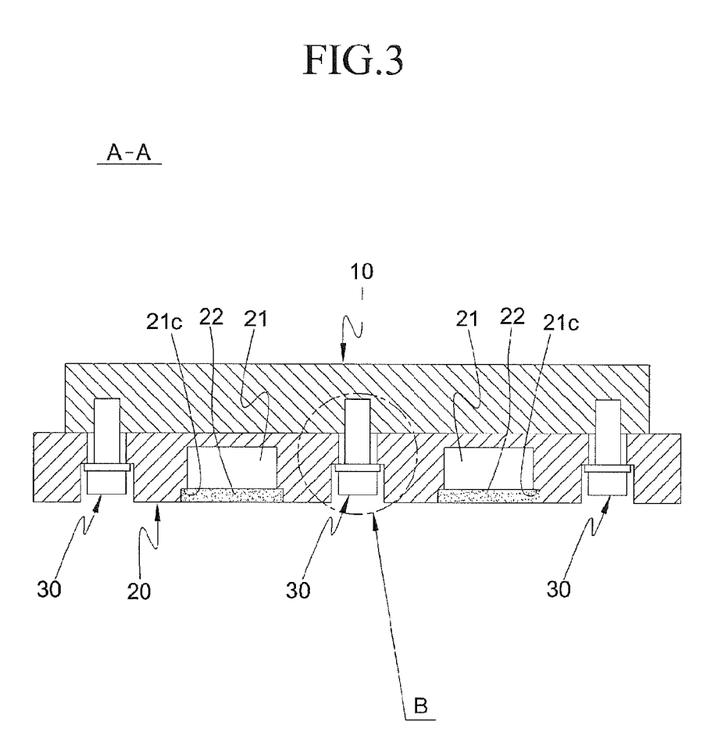
FIG. 3 is a cross-sectional view taken along line A-A in FIG. 2 and showing the non-adhesive type connecting structure of the sputtering target and the backing plate according to the invention.
Figure 4:
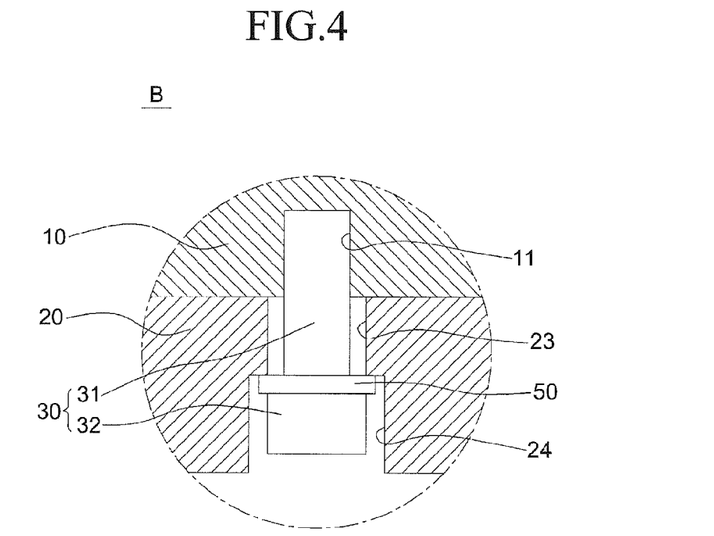
FIG. 4 is an enlarged view of portion B in FIG. 3.

FIG. 1 is an exploded perspective view showing an exemplary embodiment of a non-adhesive type connecting structure of a sputtering target and a backing plate according to an the invention, FIG. 2 is a plan perspective view showing the non-adhesive type connecting structure of the sputtering target and the backing plate of FIG. 1 according to the invention, FIG. 3 is a cross-sectional view taken along line A-A in FIG. 2 and showing the non-adhesive type connecting structure of a sputtering target and a backing plate according to the invention, and FIG. 4 is an enlarged view of portion B in FIG. 3.

Referring to FIGS. 1 to 3, an exemplary embodiment of a non-adhesive (e.g., glueless) type connecting structure of a sputtering target and a backing plate according to the invention includes a sputtering target 10, a backing plate 20, and a plurality of non-adhesive fastening members (e.g., bolts) 30.

The sputtering target 10 is substantially a plate or plate-shaped which includes a body having a longitudinal axis extending in one direction and substantially flat upper and lower surfaces opposite to each other.

The backing plate 20, which is substantially a plate or plate-shaped includes a body having a longitudinal axis extending in one direction and substantially upper and lower flat surfaces opposite to each other. The backing plate 20 is in contact with one surface of the sputtering target 10. The backing plate 20 includes a cooling member 21 such as a channel through which a cooling material such as water flows in a longitudinal direction of the body to conduct heat generated from the sputtering target 10 during a process of sputtering to outside the backing plate 20.

A lower surface of the sputtering target 10 and an upper surface of the backing plate 20 face each other and are substantially flat where they are opposite to each other. With the flat surfaces opposite to each other, the sputtering target 10 and the backing plate 20 may slide or move relative to each other without stopping with respect to contact surfaces of the sputtering target 10 and the backing plate 20, even if the sputtering target 10 and the backing plate 20 expand with different coefficients of thermal expansion. Therefore, even minute bending of the one of the sputtering target 10 and the backing plate 20, which has a larger coefficient of thermal expansion, is reduced or effectively prevented.

Further, as will be described in detail below with reference to FIG. 4, expansion and contraction of the sputtering target 10 and the backing plate 20 can be repeated without bending even though the sputtering target 10 and the backing plate 20 expand with different coefficients of thermal expansion, due a structure of the fastening members 30 with respect to the sputtering target 10 and the backing plate 20. In one exemplary embodiment, a predetermined space is provided between inner walls of upper portions of fastener receiving members and outer surfaces of lead portions of the fastening members 30, and/or a predetermined space is provided between inner walls of lower portions of fastener receiving members and outer surfaces of heads of the fastening members 30.

Consequently, as bending of the sputtering target 10 and the backing plates 20 is reduced or effectively prevented, the contact surfaces are firmly in contact with each other and the efficiency of thermal transfer from the sputtering target 10 to the backing plate 20 can be maintained.

The fastening members 30 fix the backing plate 20 and the sputtering target 10 in contact with each other. The fastening members 30 are extended through portions of the backing plate 20 excluding the cooling member, and are distributed at appropriate positions of the backing plate 20 such that the backing plate 20 and the sputtering target 10 are fixed to each other.

Referring to FIGS. 2 and 3, an exemplary embodiment of the cooling member 21 according to the invention includes an inlet 21a through which a cooling material is introduced to the backing plate 20 and an outlet 21b through which the cooling material is discharged from the backing plate 20. The cooling member 21 is exposed to the outside of the backing plate 20 by the inlet 21a and/or the outlet 21b.

The inlet 21a is at a first longitudinal end of the backing plate 20 and functions as an intake portion through which the cooling material is supplied from the outside of the backing plate 20.

The outlet 21b is at the same longitudinal end of the backing plate 20 and adjacent to the inlet 21a. The outlet 21b is in physical and fluid communication with the inlet 21a. The cooling member 21 is continuous from the inlet 21a to the outlet 21b. As illustrated in FIG. 2, the cooling member 21 is extended from the first longitudinal end of the backing plate 20, to an opposing second longitudinal end of the backing plate 20 and back to the first longitudinal end. The cooling material which is introduced from the outside through the inlet 21a adjacent to the outlet 21b at the first end of the backing plate 20, is discharged to the outside again through the outlet 21b.

The cooling member 21 may overlap portions of the backing plate 20, which corresponds to a portion of the sputtering target 10 with relatively large erosion from sputtering. Conversely, the cooling member 21 may not overlap portions of the backing plate 20 which corresponds to a portion of the sputtering target 10 with relatively little erosion from sputtering. The fastening members 30 are extended through the portions of the backing plate 20 excluding the cooling member 21, because the fastening members 30 described below are disposed at the portions of the sputtering target 10 with relatively little erosion from sputtering.

The cooling material introduced through the inlet 21a of the cooling member 21 is relatively lower in temperature than the backing plate 20, such that the cooling material absorbs and takes heat from the backing plate 20 while passing through the cooling member 21 in the backing plate 20, and is discharged to the outside through the outlet 21b of the cooling member 21. The cooling material absorbing heat while passing through the cooling member 21 and being discharged to the outside as described above, is repeated.

Figure 5:
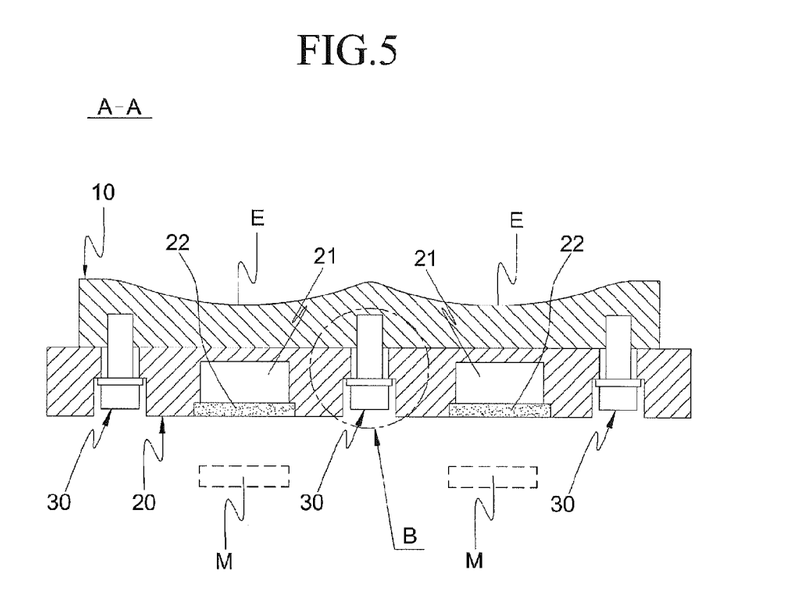
FIG. 5 is another exemplary embodiment of cross-sectional view taken along line A-A in FIG. 2 and showing the non-adhesive type connecting structure of a sputtering target and a backing plate according to the invention.

FIG. 5 is another exemplary embodiment of cross-sectional view taken along line A-A in FIG. 2 and showing the non-adhesive type connecting structure of a sputtering target and a backing plate according to the invention.

Referring to FIG. 5, a relatively large erosion is generated on a top of the sputtering target 10 adjacent to a magnet M from sputtering. Accordingly, the cross-sectional shape of the sputtering target 10 shown in FIG. 5 is recessed toward the adjacent magnet M, that is, downward from the top of the sputtering target 10, in an arc or concave shape.

As the fastening members 30 are disposed at a center portion and adjacent to both of opposing longitudinal edges, which correspond to relatively large cross-sectional thicknesses of the sputtering target 10, it is possible to use the sputtering target 10 for an increased time even when portions of the sputtering target 10 are eroded from sputtering. The arrangement of the fastening members 30 is described below in detail with reference to FIG. 2.

Referring to FIG. 2, the fastening members 30 are disposed where relatively small erosion is generated in the sputtering target 10 from sputtering. The fastening members 30 may be disposed at predetermined distances from each other and in parallel, such as along both of the opposing longitudinal edges which are parallel to a longitudinal axis of the backing plate 20. The fastening members 30 at a first longitudinal edge may be aligned with the fastening members 30 at an opposing second longitudinal edge in a direction perpendicular to the longitudinal axis as illustrated in FIG. 2, but the invention is not limited thereto.

Further, the fastening members 30 may be disposed at the center portion along a longitudinal direction parallel to the longitudinal axis of the backing plate 20. The fastening members 30 disposed at the center portion of the backing plate 20 are disposed to correspond to a middle point between adjacent fastening members 30 disposed along the opposing edges of the backing plate 20. That is, the fastening members 30 at an edge of the backing plate 20 are alternated with the fastening members 30 at the center portion, in the longitudinal direction parallel to the longitudinal axis of the backing plate 20.

As described above, the fastening members 30 are uniformly distributed at the contact surfaces (e.g., a joint) of the sputtering target 10 and the backing plate 20, such that the sputtering target 10 and the backing plate 20 are firmly fixed to each other and separation thereof is reduced or effectively prevented. Accordingly, it is possible to improve heat transfer from the sputtering target 10 to the backing plate 20.

Referring again to FIG. 1, an exemplary embodiment of the non-adhesive type connecting structure according to the invention may further include an alignment pin 40 for aligning and centering the sputtering target 10 and the backing plate 20 when the sputtering target 10 is fastened to the backing plate 20 prior to a sputtering process.

The alignment pin 40 may be disposed at a central portion where the sputtering target 10 and the backing plate 20 face each other and are in contact, in order to align and center the sputtering target 10 and the backing plate 20 when the sputtering target 10 and the backing plate 20 are fastened to each other prior to the sputtering process.

The sputtering target 10 and the backing plate 20 are fixed by aligning and centering the sputtering target 10 and the backing plate 20 while being in close proximity to each other while fitting the alignment pin 40 between the sputtering target 10 and the backing plate 20, and then fitting the fastening members 30 at desired positions of the sputtering target 10 and the backing plate 20 with respect to the alignment pin 40.

It is possible to easily fit the fastening members 30 at the desired position of the sputtering target 10 and the backing plate 20 by using the alignment pin 40 in an alignment process prior to the sputtering process.

Referring again to FIG. 4, an exemplary embodiment of the non-adhesive type connecting structure according to the invention may further include first fastener receiving members 23 (e.g., bolt holes) and stepped fastener receiving members 24 (e.g., stepped hole) collectively extended through a thickness of the backing plate 20. A first fastener receiving member 23 and a stepped fastener receiving member 24 collectively form a continuous receiving member extended through an entire thickness of the backing plate 20.

The first fastener receiving members 23 are holes or openings extended vertically through a portion of the thickness of the backing plate 20, and are dimensioned such that lead portions 31 of the fastening members 30 are received therein and pass through the portion of the thickness of the backing plate 20.

The stepped fastener receiving members 24 define an inner wall of a lower portion of the first fastener receiving members 23. A step is formed between the lower portion and an upper portion of the first fastener receiving member 23. The lower portion is expanded outward and has a larger inner width or diameter than that of the inner width or diameter of the upper portion of the first fastener receiving member 23. The stepped fastener receiving members 24 are dimensioned such that a head 32 of the fastening member 30 is received and fitted therein. The widths or diameters are taken parallel to a plane of the backing plate 20

The inner width or diameter of the upper portion of the first fastener receiving member 23 may be larger than an outer width or diameter of the lead portion 31. A predetermined space may be provided between an inner circumferential wall of the first fastener receiving member 23 and the outer width or diameter of the lead portion 31, and a predetermined space may be provided between the inner wall of the stepped fastener receiving member 24 and the outer width or diameter of the head 32, where the inner diameter of the stepped fastener receiving member 24 is larger than the outer width or diameter of the head 32.

The spaces between the inner wall of the first fastener receiving member 23 and the outer width or diameter of the lead portion 31, and between the inner wall of the stepped fastener receiving member 24 and the outer width or diameter of the head 32 may reduce or effectively prevent even minute bending of the backing plate 20 by providing a space at which the backing plate 20 can thermally expand during sputtering.

As bending of the backing plate 20 is reduced or effectively prevented, it is possible to keep the sputtering target 10 and the backing plate 20 in contact with each other, such that it is possible to keep the efficiency of heat transfer from the sputtering target to the backing plate. Further, it is possible to improve durability of the backing plate 20, which is less expendable than the expendable sputtering target 10 having a replacement period of about five years.

Referring again to FIGS. 1 and 4, an exemplary embodiment of the non-adhesive type connecting structure according to the invention may further include a fixing member 50 such as a washer including a material which is relatively stronger than the material of the backing plate 20. The fixing member 50 is fitted on the lead portion 31 of the fastening member 30.

The fixing member 50 has an outer width or diameter larger than the inner diameter of the upper portion of the first fastener receiving member 23 and keeps the sputtering target 10 and the backing plate 20 in contact with each other. The fixing member 50 remains in contact with an upper portion of the stepped fastener receiving member 24, even though the backing plate 20 thermally expands.

Referring to FIG. 4 the sputtering target 10 includes a second fastener receiving member 11 which is aligned with the first fastener receiving member 23 of the backing plate 20. The lead portion 31 of the fastening member 30 is in both the first and second fastener receiving members 23 and 24. In an exemplary embodiment, the lead portion 21 may be threaded and thread-fastened to the first and/or second fastener receiving members 23 and 24.

Referring to FIG. 3, the backing plate 20 includes a step 21c at a lower portion thereof at a position of the cooling member 21. The step 21c is extended parallel to the longitudinal axis of the backing plate 20. A width of the lower portion of the backing plate 20 at the cooling member 21 is extended outward from walls at a lower end of the cooling member 21. A cover 22 is attached such as by welding from below the backing plate 20. The cover 22 may be plate-shaped cover and closes the cooling member 21 at the step 21c. Since the backing plate 20 and the cover 22 are integrally connected such as by welding, the backing plate 20 and the cover 22 may include the same material and have the same coefficient of thermal expansion. Alternatively, the cooling member 21 may be closed by a continuous portion of the backing plate 20 as illustrated in FIG. 1, such that the backing plate 20 is a single, unitary, indivisible member.

As illustrated in FIG. 3, a lower surface of the backing plate 20 may be disposed at the same height as a lower surface of the cover 22, such that the lower surfaces are coplanar with each other. The lower surfaces being coplanar allow the backing plate 20 to be firmly fixed to a work table when the backing plate 20 is placed on the work table such that the lower surface of the backing plate 20 is positioned facing the work table, with the cooling member 21 closed by the cover 22.

In one exemplary embodiment for this configuration, the lower surface of the backing plate 20 is smoothly polished while the cover is attached to the lower surface of the backing plate 20 such as by welding.

In an exemplary embodiment according to the invention, the sputtering target 10 and the backing plate 20 may include any one of aluminum (Al) and copper (Cu), or similarly materials, which are relatively inexpensive and have high heat transfer efficiency.

Further, in an exemplary embodiment according to the invention, the sputtering target 10 and the backing plate 20 may include a material having an average coefficient of thermal expansion not more than $19 \times 10^{-6}/°C$. at a temperature of about 20° C. to about 160° C.

The amount of thermal expansion is expressed by the following Equation 1.

Amount of thermal expansion=Length in millimeters (mm)×Thermal expansion coefficient×Temperature change in degrees Celsius ($\Delta t°$ C.) [Equation 1]

In an exemplary embodiment, when the target including copper (Cu) was 2.65 meters (m) long and the temperature of a processing room was 150° C. during sputtering. As can be seen from the following Equation 2, the length of the sputtering target increased by 7.15 mm and the coefficient of thermal expansion was $18 \times 10^{-6}/°$ C., $7.15\ mm = 2.65\ m \times 18 \times 10^{-6}/°C. \times 150°C.$ [Equation 2]

In another exemplary embodiment, the backing plate including copper (Cu) was 3.0 m long and the temperature of the processing room was 150° C. during sputtering. As can be seen from the following Equation 3, the length of the backing plate increased by 8.1 mm and the coefficient of thermal expansion was $18 \times 10^{-6}/°$ C.

$8.1\ mm = 3.0\ m \times 18 \times 10^{-6}/°C. \times 150°C.$ [Equation 3]

Considering the minimum tensile strength of 700 newtons per square millimeter ($N/mm^2$) and the critical tension strength of 71.4 kilogram-force per square millimeter ($kgf/mm^2$) of a restoring force of the exemplary embodiment of the fastening member 30 according to the invention, and the amount of thermal expansion at the space between the inner wall of the first fastener receiving member 23 and the outer width or diameter of the lead portion 31 and at the space between the inner wall of the stepped fastener receiving member 24 and the width or diameter of the head 32, the exemplary embodiment of the sputtering target 10 and the backing plate 20 according to the invention may have an average coefficient of thermal expansion of $19 \times 10^{-6}/°$ C. or less at temperature of about 20° C. to about 160° C., in order to reduce or effectively prevent bending of the sputtering target 10 and the backing plate 20 that are integrally combined with each other.

What is claimed is:

1. A non-adhesive sputtering structure, comprising:
   a sputtering target having a plate shape and including a target material;
   a backing plate having a plate shape, wherein the backing plate faces the sputtering target, and facing surfaces of the sputtering target and the backing plate are in contact with each other,
   the backing plate comprising:
   a body having a longitudinal axis;
   a cooling member through which a cooling material flows in a longitudinal direction of the body substantially parallel to the longitudinal axis, wherein the cooling material conducts heat generated from the sputtering target from sputtering to outside the backing plate;
   an outwardly extended step defined at both of opposing sides of a lower end of the cooling member, wherein the step is extended in the longitudinal direction of the body, and the lower end of the cooling member is open and exposes the cooling member to outside the backing plate body, and
   a cover having a plate shape, wherein the cover is attached to the step, overlaps the open lower end of the cooling member and closes the cooling member to the outside of the backing plate body; and
   a plurality of non-adhesive fastening members which maintain the facing surfaces of the backing plate and the sputtering target in contact with each other,
   wherein
   the non-adhesive fastening members are extended through a thickness of the backing plate and into the sputtering target, and correspond to regions of the backing plate excluding the cooling member, and the sputtering target having the non-adhesive fastening members extended thereinto, is slidably movable relative to the backing plate with respect to the contacting facing surfaces of the sputtering target and the backing plate.

2. The non-adhesive sputtering structure of claim 1, wherein the cooling member includes:

an inlet at a first longitudinal end of the backing plate through which the cooling material is supplied to the cooling member; and an outlet at the first longitudinal end of the backing plate through which the cooling material is discharged to the outside, wherein the cooling member is continuous from the inlet at the first longitudinal end, to an opposing second longitudinal end of the backing plate and to the outlet at the first longitudinal end of the backing plate.

3. The non-adhesive sputtering structure of claim 1, wherein:

the cooling member of the backing plate is overlapped with a first region of the sputtering target including an amount of erosion of the target material from the sputtering which is larger than a remaining second portion of the sputtering target.

4. The non-adhesive sputtering structure of claim 3, wherein:

the non-adhesive fastening members are overlapped with the second region of the sputtering target including an amount of erosion of the target material from the sputtering which is less than the first region.

5. The non-adhesive sputtering structure of claim 1, wherein:

the non-adhesive fastening members are spaced apart at predetermined distances along both of opposing edges of the backing plate and parallel to the longitudinal axis of the backing plate, and are spaced apart along a center portion of the backing plate and parallel to the longitudinal axis of the backing plate, and the non-adhesive fastening members at the center portion of the backing plate are between adjacent non-adhesive fastening members along edges of the backing plate, in a direction parallel to the longitudinal axis.

6. The non-adhesive sputtering structure of claim 5, further comprising:

an alignment pin at the center of the sputtering target and the backing plate in contact with each other, wherein the alignment pin centers the sputtering target and the backing plate with respect to each other when the sputtering target and the backing plate are brought into contact with each other.

7. The non-adhesive sputtering structure of claim 1, wherein:

the backing plate further comprises first fastener receiving members which are extended through the thickness of the backing plate and through which a lead portion of the non-adhesive fastening members is passed, wherein a width of a lower portion of the first fastener receiving members is larger than a width of an upper portion of the first fastener receiving members to form a step portion of the first fastener receiving member, and heads of the non-adhesive fastening members are received in the lower portion, the width of the upper portion of the first fastener receiving members is larger than a width of the lead portion, and a predetermined space is between an inner wall of the upper portion of the first fastener receiving members and an outer surface of the lead portion, and the width of the lower portion of the first fastener receiving members is larger than a width of the head, and a predetermined space is between an inner wall of the lower portion of the first fastener receiving members and an outer surface of the head.

8. The non-adhesive sputtering structure of claim 7, further comprising:

a fixing member including a metal which is relatively stronger than a material of the backing plate, wherein the fixing member has a width larger than the width of the upper portion of the first fastener receiving members, and is in contact with both the step portion of the first fastener receiving member and the head of the non-adhesive fastening member.

9. The non-adhesive sputtering structure of claim 1, wherein:

a lower surface of the backing plate and a lower surface of the cover are coplanar.

10. The non-adhesive sputtering structure of claim 1, wherein:

the sputtering target and the backing plate have an average coefficient of thermal expansion of $19 \times 10^{-6}/°$ C. or less at temperature of about 20° C. to about 160° C.

11. The non-adhesive sputtering structure of claim 1, wherein:

the sputtering target and the backing plate include one of aluminum (Al) and copper (Cu).

12. A method of forming a structure for sputtering, the method comprising:

disposing a sputtering target including a target material, facing and contacting a backing plate;

wherein the backing plate comprises:

a body having a longitudinal axis;

a cooling member through which a cooling material flows in a longitudinal direction of the body substantially parallel to the longitudinal axis, wherein the cooling material conducts heat generated from the sputtering target from sputtering, to outside the backing plate;

an outwardly extended step defined at both of opposing sides of a lower end of the cooling member, wherein the step is extended in the longitudinal direction of the body, and the lower end of the cooling member is open and exposes the cooling member to outside the backing plate body, and a cover having a plate shape, wherein the cover is attached to the step, overlaps the open lower end of the cooling member and closes the cooling member to the outside of the backing plate body; and disposing a plurality of non-adhesive fastening members through a thickness of the backing plate and into the sputtering target, wherein the plurality of non-adhesive fastening members corresponds to regions of the backing plate excluding the cooling member, and maintains facing surfaces of the backing plate and the sputtering target in contact with each other, and the sputtering target having the non-adhesive fastening members extended thereinto, is slidably movable relative to the backing plate with respect to the contacting facing surfaces of the sputtering target and the backing plate.

* * * * *